(12) United States Patent
Koh et al.

(10) Patent No.: US 9,255,324 B2
(45) Date of Patent: Feb. 9, 2016

(54) ALUMINUM PRECURSOR COMPOSITION

(71) Applicant: Up Chemical Co., Ltd., Gyeonggi-do (KR)

(72) Inventors: Wonyong Koh, Daejeon (KR); Won Seok Han, Anseong-si (KR); Myeong-Ho Park, Suwon-si (KR)

(73) Assignee: UP CHEMICAL CO., LTD. (KR)

( * ) Notice: Subject to any disclaimer, the term of this patent is extended or adjusted under 35 U.S.C. 154(b) by 267 days.

(21) Appl. No.: 13/966,605

(22) Filed: Aug. 14, 2013

(65) Prior Publication Data
US 2014/0050848 A1    Feb. 20, 2014

Related U.S. Application Data

(60) Provisional application No. 61/683,257, filed on Aug. 15, 2012.

(51) Int. Cl.
*C23C 16/20* (2006.01)
*C23C 16/06* (2006.01)

(52) U.S. Cl.
CPC ................. *C23C 16/20* (2013.01); *C23C 16/06* (2013.01)

(58) Field of Classification Search
CPC .............................. C23C 16/06; C23C 16/20
See application file for complete search history.

(56) References Cited

U.S. PATENT DOCUMENTS

| | | | | |
|---|---|---|---|---|
| 5,113,025 A | * | 5/1992 | Park et al. | 568/814 |
| 7,192,649 B1 | * | 3/2007 | Jouet et al. | 428/457 |
| 8,742,128 B2 | * | 6/2014 | Fukui et al. | 546/348 |
| 8,927,059 B2 | * | 1/2015 | Lu et al. | 427/250 |
| 2013/0157475 A1 | * | 6/2013 | Thompson et al. | 438/778 |

OTHER PUBLICATIONS

Liu et al, "Chemical Vapor Deposition of aluminum form methylpyrrolidine alane complex" Thin Solid Films, (2006) pp. 48-54.*
Liu et al, "Effect of substrate on the nucleation and growth of aluminum films deposited from methypyrrolidine alane", Thin Solid Films, (2007) pp. 6730-6736.*
Olsthoorn, et al., "Photoluminescence on highquality AlxGa1-xAs Grown by Metalorganic vaporphase epitaxy using alane bis(dimethylethylamine)", Applied Physics Letters, vol. 60, p. 82, 1992.

* cited by examiner

*Primary Examiner* — David M Brunsman (57) ABSTRACT

The present disclosure is related to an aluminum-containing precursor composition, especially a precursor composition which is vaporized to be used for vapor phase deposition processes such as chemical vapor deposition (CVD) or atomic layer deposition (ALD).

11 Claims, 9 Drawing Sheets

ALUMINUM PRECURSOR COMPOSITION

FIELD OF THE INVENTION

The present disclosure is related to an aluminum-containing precursor composition, especially a precursor composition which is vaporized to be used for vapor-phase deposition processes such as chemical vapor deposition (CVD) or atomic layer deposition (ALD).

BACKGROUND OF THE INVENTION

Alane-amine adducts were used to deposit aluminum-containing films by vapor phase deposition process [S. M. Olsthoorn, F. A. J. M. Driessen, L. J. Giling, D. M. Frigo, and C. J. Smit, "Photoluminescence on high-quality $Al_xGa_{1-x}As$ grown by metalorganic vapor-phase epitaxy using alane bis (dimethylethylamine)" Applied Physics Letters, Volume 60, p 82 (1992)]. Among alane-amine adducts, dimethylethylamine-alane (DMEAA) and N-methylpyrroridine-alane (MPA) are frequently used because both are in a liquid state at ambient temperature. Especially, N-methylpyrroridine-alane, an alane adduct with a cyclic amine, N-methylpyrrolidine (MP), represented by $AlH_3.MP$ (MPA), is more stable than DMEAA and thus is more suitable as a chemical vapor deposition precursor. However, N-methylpyrroridine-alane is still not thermally stable. At 60° C., N-methylpyrroridine-alane is decomposed to generate N-methylpyrrolidine (MP), which could be observed by Fourier-transform infrared (FT-IR) spectroscopy [J. M. Lee et al., "A noble metallization process using Preferential Metal Deposition (PMD)-aluminum with methylpyrroridine alane (MPA)" International Interconnect Technology Conference, San Francisco, Jun. 4-6, 2001, Proceedings of the IEEE 2001 International Interconnect Technology Conference, 2001, p 72. http://ieeexplore.ieee.org/xpl/articleDetails.jsp?tp=&arnumb er=930021].

BRIEF SUMMARY OF THE INVENTION

In view of the foregoing, the present disclosure provides a stable precursor composition including $AlH_3$ (alane) and N-methylpyrrolidine (MP) in a certain equivalent ratio, which can be in a liquid state at ambient temperature and thus suitable for a vapor phase deposition process.

In accordance with an aspect of the present disclosure, there is provided a precursor composition for depositing an aluminum-containing thin film, including $AlH_3$ and N-methylpyrrolidine (MP). The precursor composition can be obtained by mixing N-methylpyrroridine-alane (MPA) adduct with N-methylpyrrolidine (MP) in a range of a certain equivalent ratio of N-methylpyrrolidine (MP) to $AlH_3$ (alane).

In accordance with another aspect of the present disclosure, there is provided a manufacturing method of a precursor composition for depositing an aluminum-containing thin film, including mixing N-methylpyrroridine-alane (MPA) adduct with N-methylpyrrolidine (MP).

In accordance with still another aspect of the present disclosure, there is provided a manufacturing method of an aluminum-containing thin film using a precursor composition in accordance with first aspect of the present disclosure.

DETAILED DESCRIPTION OF THE INVENTION

Hereinafter, illustrative embodiments and examples will be described in detail so that inventive concept may be readily implemented by those skilled in the art.

However, it is to be noted that the present disclosure may not be limited to the illustrative embodiments and examples but can be realized in various other ways. In drawings, parts irrelevant to the description are omitted for the simplicity of explanation, and like reference numerals denote like parts through the whole document.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

A precursor composition for depositing an Al-containing thin film in accordance with first aspect of the present disclosure includes $AlH_3$ and N-methylpyrrolidine (MP).

In accordance with an illustrative embodiment, the precursor composition may be obtained by mixing N-methylpyrroridine-alane adduct ($AlH_3.MP$, which can be also represented by MPA) with N-methylpyrrolidine. However, the present disclosure may not be limited thereto.

In accordance with an illustrative embodiment, there is provided the precursor composition in which a ratio of N-methylpyrrolidine (MP) to about 1 equivalent of $AlH_3$ can be from greater than about 1 equivalent to no more than about 1.35 equivalent, or no less than about 2.25 equivalent.

In some embodiments according to the present disclosure, the ratio of N-methylpyrrolidine (MP) to about 1 equivalent of $AlH_3$ can be from greater than about 1 equivalent to no more than about 1.35 equivalent, no more than about 1.34 equivalent, no more than about 1.33 equivalent, no more than about 1.32 equivalent, no more than about 1.31 equivalent, no more than about 1.3 equivalent, no more than about 1.29 equivalent, no more than about 1.28 equivalent, no more than about 1.27 equivalent, no more than about 1.26 equivalent, no more than about 1.25 equivalent, no more than about 1.24 equivalent, no more than about 1.23 equivalent, no more than about 1.22 equivalent, no more than about 1.21 equivalent, no more than about 1.2 equivalent, no more than about 1.19 equivalent, no more than about 1.18 equivalent, no more than about 1.17 equivalent, no more than about 1.16 equivalent, no more than about 1.15 equivalent, no more than about 1.14 equivalent, no more than about 1.13 equivalent, no more than about 1.12 equivalent, no more than about 1.11 equivalent, no more than about 1.1 equivalent, or no more than about 1.05 equivalent.

In other embodiments according to the present disclosure, the ratio of N-methylpyrrolidine (MP) to 1 equivalent of AlH$_3$ can be no less than about 2.25 equivalent, no less than about 2.26 equivalent, no less than about 2.27 equivalent, no less than about 2.28 equivalent, no less than about 2.29 equivalent, or no less than about 2.3 equivalent.

In accordance with an illustrative embodiment, there is provided the precursor composition in which the ratio of N-methylpyrrolidine (MP) to 1 equivalent of AlH$_3$ is from no less than about 2.25 equivalent to no more than about 1,000 equivalent.

For example, the ratio of N-methylpyrrolidine (MP) to 1 equivalent of AlH$_3$ can be from no less than about 2.25 equivalent to no more than about 1,000 equivalent, from no less than about 2.25 equivalent to no more than about 900 equivalent, from no less than about 2.25 equivalent to no more than about 800 equivalent, from no less than about 2.25 equivalent to no more than about 700 equivalent, from no less than about 2.25 equivalent to no more than about 600 equivalent, from no less than about 2.25 equivalent to no more than about 500 equivalent, from no less than about 2.25 equivalent to no more than about 400 equivalent, from no less than about 2.25 equivalent to no more than about 300 equivalent, from no less than about 2.25 equivalent to no more than about 200 equivalent, from no less than about 2.25 equivalent to no more than about 100 equivalent, from no less than about 2.25 equivalent to no more than about 80 equivalent, from no less than about 2.25 equivalent to no more than about 60 equivalent, from no less than about 2.25 equivalent to no more than about 40 equivalent, from no less than about 2.25 equivalent to no more than about 20 equivalent, or from no less than about 2.25 equivalent to no more than about 10 equivalent.

For example, the ratio of N-methylpyrrolidine (MP) to 1 equivalent of AlH$_3$ can be from no less than about 2.3 equivalent to no more than about 1,000 equivalent, from no less than about 2.3 equivalent to no more than about 900 equivalent, from no less than about 2.3 equivalent to no more than about 800 equivalent, from no less than about 2.3 equivalent to no more than about 700 equivalent, from no less than about 2.3 equivalent to no more than about 600 equivalent, from no less than about 2.3 to no more than about 500 equivalent, from no less than about 2.3 equivalent to no more than about 400 equivalent, from no less than about 2.3 equivalent to no more than about 300 equivalent, from no less than about 2.3 equivalent to no more than about 200 equivalent, from no less than about 2.3 equivalent to no more than about 100 equivalent, from no less than about 2.3 equivalent to no more than about 80 equivalent, from no less than about 2.3 equivalent to no more than about 60 equivalent, from no less than about 2.3 equivalent to no more than about 40 equivalent, from no less than about 2.3 equivalent to no more than about 20 equivalent, or from no less than about 2.3 equivalent to no more than about 10 equivalent. However, the present disclosure may not be limited thereto.

In accordance with an illustrative embodiment, the precursor composition is in a liquid state at ambient temperature.

A simple addition of N-methylpyrrolidine to N-methylpyrroridine-alane adduct does not generate a solution or a liquid state which is suitable for vapor phase deposition processes because such simple addition of N-methylpyrrolidine to N-methylpyrroridine-alane can generate a solid or a precipitate. The bulk of the mixture may exist in a solid form when one equivalent of N-methylpyrrolidine is added to N-methylpyrroridine-alane. Thus, for example, the 1:1 equivalent mixture of N-methylpyrroridine-alane and N-methylpyrrolidine cannot be used by a direct liquid injection (DLI) technique for a vapor phase deposition process.

In one embodiment of the present disclosure, an addition of N-methylpyrrolidine of about more than one equivalent may generate a liquid-phase solution. For example, about 1:about 1.25 equivalent mixture of N-methylpyrroridine-alane and N-methylpyrrolidine (in other words, a composition of AlH$_3$:MP=1:about 2.25) can exist as a transparent solution at ambient temperature.

When small amount of N-methylpyrrolidine (MP) was added to liquid AlH$_3$.MP, the solid containing AlH$_3$.(MP)$_2$ can be dissolved in liquid AlH$_3$.MP to give a transparent solution or liquid. However, further addition of N-methylpyrrolidine generates too much solid containing AlH$_3$.(MP)$_2$ to be completely dissolved in remaining liquid AlH$_3$.MP, and thus the solid containing AlH$_3$.(MP)$_2$ can be precipitated. When one equivalent of N-methylpyrrolidine is added to the AlH$_3$.MP, the bulk of the mixture exists in a solid form. Still further addition of N-methylpyrrolidine to AlH$_3$.(MP)$_2$, the solid containing AlH$_3$.(MP)$_2$ is now dissolved in liquid N-methylpyrrolidine. Further addition of N-methylpyrrolidine gives a completely transparent liquid solution. Further addition of N-methylpyrrolidine maintains the transparent liquid phase. The solid is not a stable phase under vacuum condition or vaporization condition. Even at ambient temperature under vacuum, the solid loses N-methylpyrrolidine and becomes a transparent liquid phase, which is essentially AlH$_3$.MP.

In accordance with an illustrative embodiment, the precursor composition may be used for chemical vapor deposition or atomic layer deposition to form an aluminum-containing thin film.

In accordance with an illustrative embodiment, the aluminum-containing thin film may further include one or more other metals which are used in the art. For example, the further metal may be selected from the group consisting of Ni, Co, Fe, Pt, Au, Al, Cr, Cu, Mg, Mn, Mo, Rh, Si, Ta, Ti, W, U, V, Zr, Ge, Ru, Ir, or combination thereof, but the present disclosure may not be limited thereto.

In accordance with an illustrative embodiment, the precursor composition may be used for the chemical vapor deposition or the atomic layer deposition with a direct liquid injection (DLI) of the precursor composition. However, the present disclosure may not be limited thereto.

The mixed composition of N-methylpyrroridine-alane with N-methylpyrrolidine according to the present disclosure, which is in a liquid state at ambient temperature, can be used conveniently for chemical vapor deposition by direct liquid injection technique. By using direct liquid injection technique, the supply of alane can be easily controlled by liquid dosing into the direct liquid injection subsystem. The difference in vapor pressures of N-methylpyrroridine-alane and N-methylpyrrolidine is no problem for direct liquid injection technique because the liquid supplied into a direct liquid injection subsystem is vaporized completely in the direct liquid injection subsystem and all of the vaporized N-methylpyrroridine-alane and N-methylpyrrolidine are supplied over a substrate in a vapor deposition system. The decomposition of N-methylpyrroridine-alane may be suppressed due to the presence of the excess N-methylpyrrolidine in the vapor phase as compared to the case of using N-methylpyrroridine-alane vapor without additional N-methylpyrrolidine in the vapor phase. The liquid mixture of N-methylpyrroridine-alane with N-methylpyrrolidine for direct liquid injection according to the present disclosure may have a composition of $AlH_3.(MP)_x$ where x is $1 < x \leq 1.35$ or $x \geq 2.25$. In one embodiment of the present disclosure, the composition of $AlH_3.(MP)_x$ for direct liquid injection may have the value of x as large as about 1000. However, a large value of x brings a large excess amount of N-methylpyrrolidine as compared to N-methylpyrroridine-alane, which may cause a problem for a vapor deposition system. Thus, the upper limit of the value of x can be more preferably as large as about 200 equivalent, about 100 equivalent, about 50 equivalent, about 30 equivalent, about 20 equivalent, about 10 equivalent, about 5 equivalent, or about 3 equivalent.

In accordance with an illustrative embodiment, there is provided the precursor composition in which the ratio of N-methylpyrrolidine (MP) to 1 equivalent of $AlH_3$ is from no less than about 2.25 equivalent to no more than about 1,000 equivalent, or from about 2.3 equivalent to no more than about 1,000 equivalent. However, the present disclosure may not be limited thereto.

In accordance with an illustrative embodiment, there is provided the precursor composition in which the ratio of N-methylpyrrolidine (MP) to 1 equivalent of $AlH_3$ is from no less than about 2.25 equivalent to no more than about 200 equivalent, or from about 2.3 equivalent to no more than about 200 equivalent. However, the present disclosure may not be limited thereto.

In accordance with an illustrative embodiment, there is provided the precursor composition in which the ratio of N-methylpyrrolidine (MP) to 1 equivalent of $AlH_3$ is from no less than about 2.25 equivalent to no more than about 20 equivalent, or from about 2.3 equivalent to no more than about 20 equivalent. However, the present disclosure may not be limited thereto.

In accordance with an illustrative embodiment, there is provided the precursor composition in which the ratio of N-methylpyrrolidine (MP) to 1 equivalent of $AlH_3$ is from no less than about 2.25 equivalent to no more than about 3 equivalent, or from about 2.3 equivalent to no more than about 3 equivalent. However, the present disclosure may not be limited thereto.

In accordance with an illustrative embodiment, the precursor composition may be used for the chemical vapor deposition or the atomic layer deposition with a bubbler-type container for the precursor composition. However, the present disclosure may not be limited thereto.

The liquid mixed composition of N-methylpyrroridine-alane with N-methylpyrrolidine may be also used in a conventional bubbler-type precursor container, where the carrier gas picks up the vapor of a liquid precursor. In this case, the carrier gas needs to be pre-saturated with N-methylpyrrolidine before picking up the vapor. Otherwise the liquid mixed composition of N-methylpyrroridine-alane with N-methylpyrrolidine loses more N-methylpyrrolidine than N-methylpyrroridine-alane; and becomes essentially N-methylpyrroridine-alane. When N-methylpyrrolidine-presaturated carrier gas is used, the composition of $AlH_3.(MP)_x$ where x is $1 < x \leq 1.35$ may not be preferable for the precursor composition because the N-methylpyrrolidine brought by carrier gas can generate solid $AlH_3.(MP)_2$ in the precursor container. The liquid mixture of N-methylpyrroridine-alane and N-methylpyrrolidine having the composition of $AlH_3.(MP)_x$ where x is x≥about 2.25, or x≥about 2.3 may not have such limitation when used in a conventional bubbler-type precursor container. The composition $AlH_3.(MP)_x$ for a conventional bubbler-type precursor container may have the value of x as large as about 1,000 equivalent. However, the precursor composition having large value of x may bring large excess amount of N-methylpyrrolidine as compared to N-methylpyrroridine-alane, so the value of x may be more preferably as large as about 200 equivalent, more preferentially as large as about 20 equivalent, or further more preferentially as large as about 3 equivalent.

N-methylpyrroridine-alane can be synthesized according to any known methods and vacuum distilled before its use.

In accordance with second aspect of the present disclosure, there is provided a manufacturing method of a precursor composition for depositing aluminum-containing thin film including mixing N-methylpyrroridine-alane (MPA) adduct with N-methylpyrrolidine (MP).

In accordance with an illustrative embodiment, there is provided the manufacturing method in which a ratio of N-methylpyrrolidine (MP) to 1 equivalent of N-methylpyrroridine-alane (MPA) is greater than 0 equivalent to no more than about 0.35 equivalent, or from no less than about 1.25 equivalent.

In accordance with an illustrative embodiment, there is provided the manufacturing method in which the ratio of N-methylpyrrolidine (MP) to 1 equivalent of N-methylpyrroridine-alane (MPA) is from no less than about 1.25 equivalent to no more than about 20 equivalent, about no more 200 equivalent, or about no more 1,000 equivalent.

In accordance with third aspect of the present disclosure, there is provided a manufacturing method of an aluminum-containing thin film using a precursor composition in accordance with first aspect of the present disclosure.

Hereinafter, examples according to the present disclosure will be explained in detail, but the present disclosure may not be limited thereto.

EXAMPLES

Figure 1A:
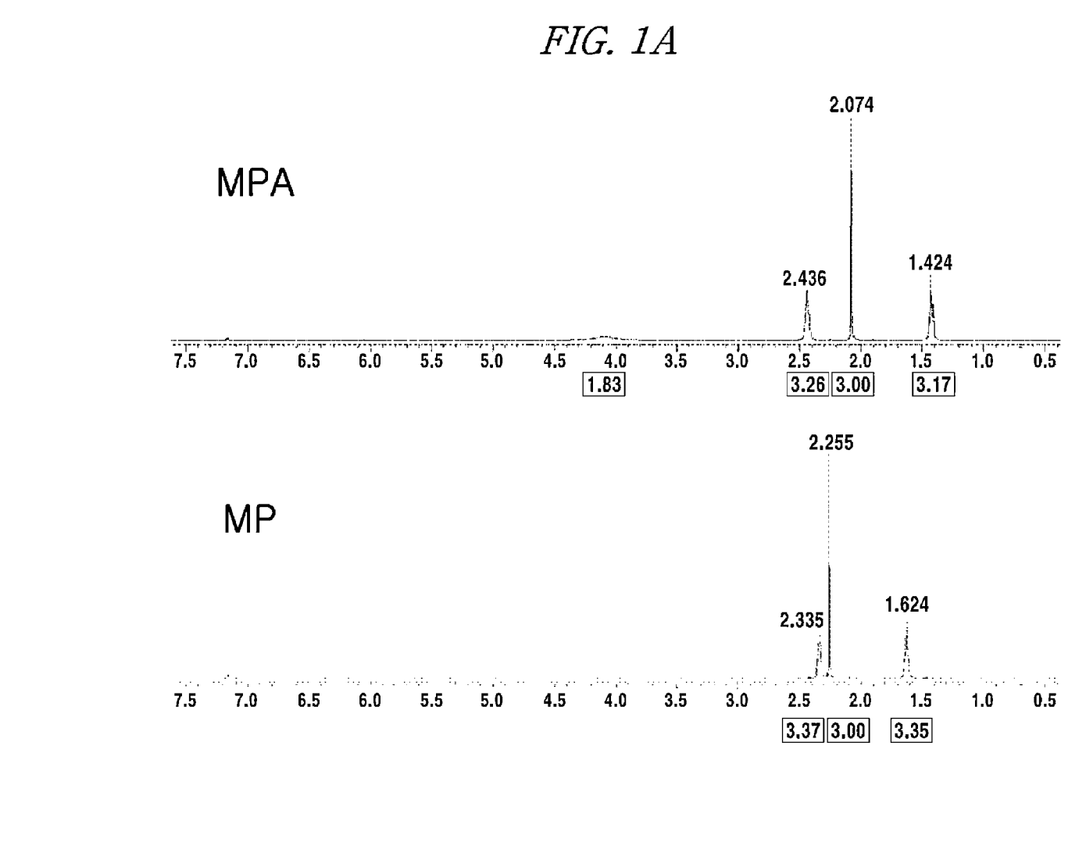
FIG. 1A is a general NMR (nuclear magnetic resonance) spectra of N-methylpyrrolidine-alane (MPA) and N-methyl pyrrolidine (MP)
Figure 1B:
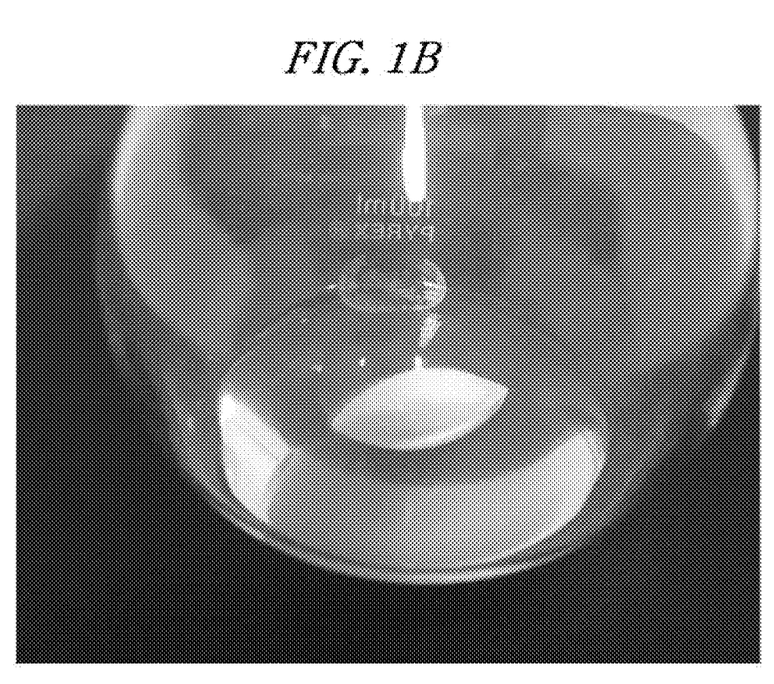
FIG. 1B is a photographic image of methylpyrrolidine-alane adduct in accordance with an illustrative embodiment of the present invention.

FIG. 1A shows the general NMR (nuclear magnetic resonance) spectra of N-methylpyrrolidine-alane (MPA, top) and N-methylpyrrolidine (MP, bottom) which were referred to confirm the presence of each of MPA and MP in the present examples below. FIG. 1B shows a photographic image of methylpyrrolidine-alane adduct in a transparent liquid phase.

Comparative Example 1

Under an inert atmosphere, 9.20 g (80.0 mmol, 1 equivalent) of liquid N-methylpyrroridine-alane was mixed with 6.80 g (79.9 mmol, 1.00 equivalent) of liquid N-methylpyrroridine, thereby the bulk of the mixture formed a white solid since solid $AlH_3.(MP)_2$ was formed. The white solid was then melted completely at 40° C. to form a transparent solution and was then re-solidified when cooled down to ambient temperature.

Example 1

Figure 2A:
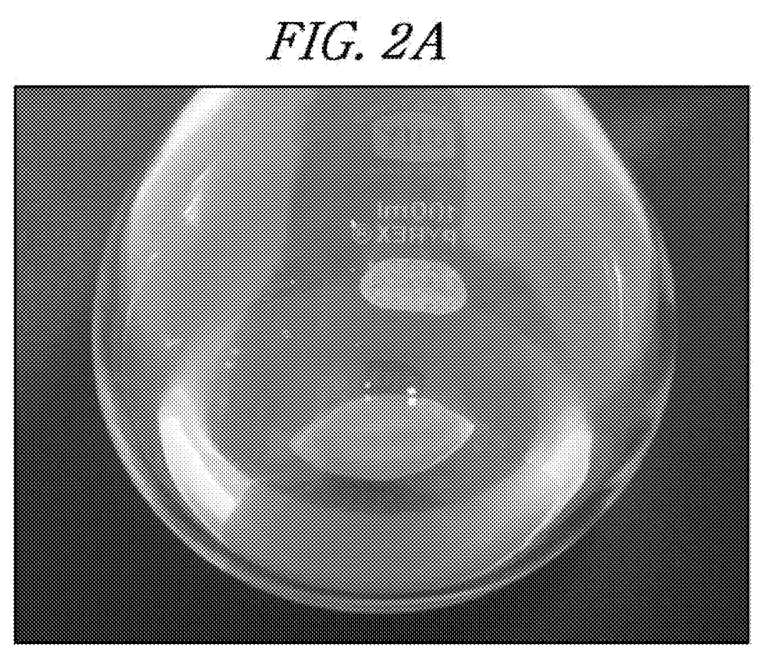
FIGS. 2A to 2D are photographic images of the mixture of N-methylpyrrolidine-alane and N-methylpyrrolidine in accordance with an illustrative embodiment of the present invention.
Figure 2B:
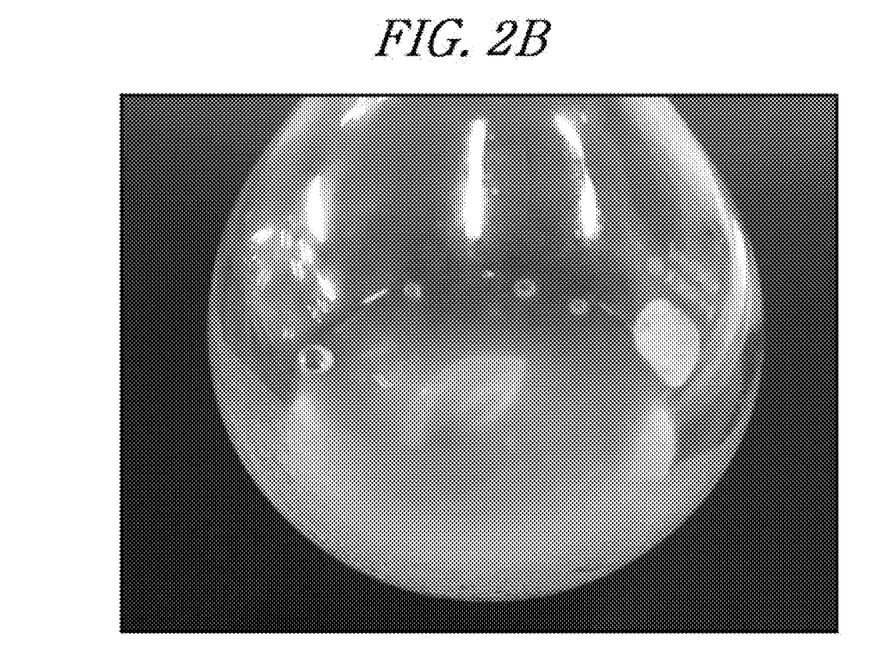
Figure 2C:
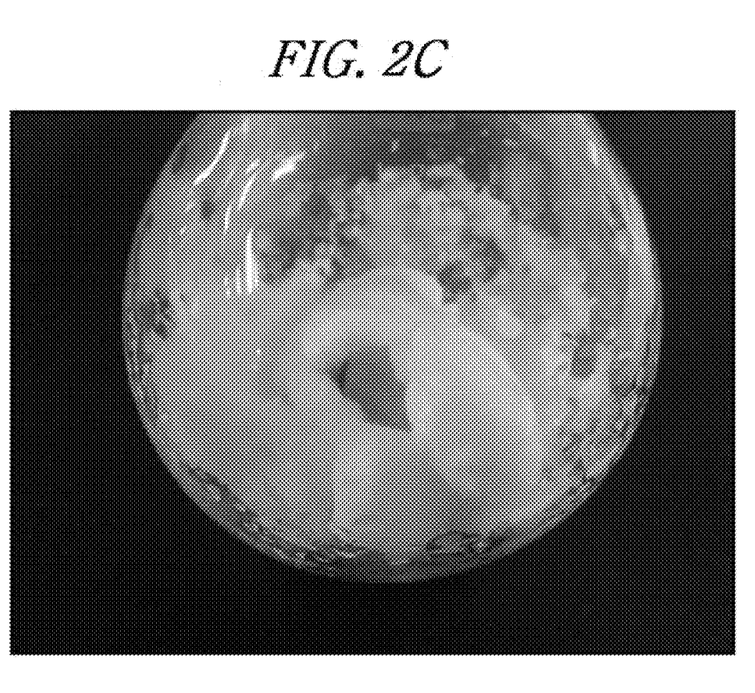
Figure 2D:
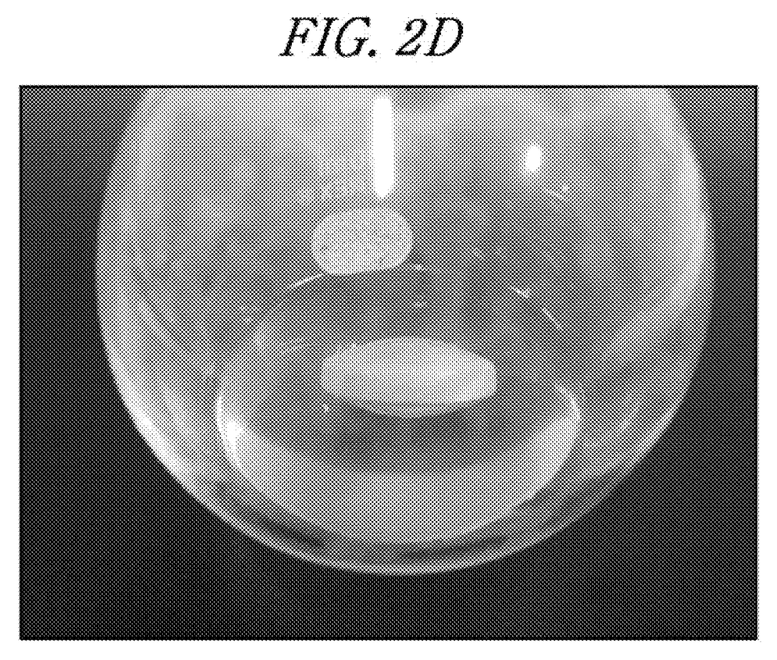

Under an inert atmosphere, 9.10 g (79.0 mmol, 1 equivalent) of liquid N-methylpyrrolidine-alane was mixed with 9.08 g (107 mmol, 1.35 equivalent) of liquid N-methylpyrrolidine. The mixture became a completely transparent solution (FIG. 2A). The mixture was put under vacuum while maintaining the temperature at 22-24° C. Since N-methylpyrrolidine has a high vapor pressure, volatile N-methylpyrrolidine included in the mixture was evaporated gradually under the vacuum condition thereby the weight of the mixture was decreased. When the weight of the mixture was decreased by 0.70 g (8.2 mmol and 0.10 equivalent as N-methylpyrrolidine), white precipitates, containing presumably $AlH_3 \cdot (MP)_2$, started to appear since N-methylpyrrolidine was not enough any more to dissolve solid $AlH_3 \cdot (MP)_2$ completely (FIG. 2B). Further removal of the volatile N-methylpyrrolidine component (decreased by 3.5 g, 0.52 equivalent as N-methylpyrrolidine) resulted in generating more solid (FIG. 2C). Upon still further removal of the volatile N-methylpyrroridine component, the mixed composition became a transparent liquid again, and the weight loss became very slow when its weight decreased to 9.18 g, assumably 9.10 g of N-methylpyrrolidine-alane plus 0.08 g (1 mmol, 0.01 equivalent) of N-methylpyrrolidine (FIG. 2D). The nuclear magnetic resonance (NMR) spectrum of the residual liquid was identical with that of N-methylpyrroridine-alane adduct.

Example 2

Under an inert atmosphere, 5.92 g (70 mmol, 0.30 equivalent) of N-methylpyrrolidine (MP) was slowly added to 26.7 g (232 mmol, 1 equivalent) of N-methylpyrroridine-alane (MPA) while mixing. The mixture still existed as a transparent liquid solution since formed solid $AlH_3 \cdot (MP)_2$ was completely dissolved in liquid N-methylpyrrolidine-alane. When further 2.57 g (30 mmol, 0.13 equivalent) of MP was added, white solids, containing presumably $AlH_3 \cdot (MP)_2$, were thereby formed in the solution. The mixture containing the white solid was put under vacuum while maintaining the temperature at 25° C. thereby the volatile N-methylpyrroridine component was continuously evaporated. The white solid completely disappeared when the weight was decreased by 1.6 g (19 mmol and 0.08 equivalent as N-methylpyrrolidine. It was assumed that the remaining composition contained 26.7 g (232 mmol, 1 equivalent) of N-methylpyrroridine-alane and 6.89 g (81 mmol, 0.35 equivalent) of N-methylpyrrolidine.

Example 3

Figure 3:
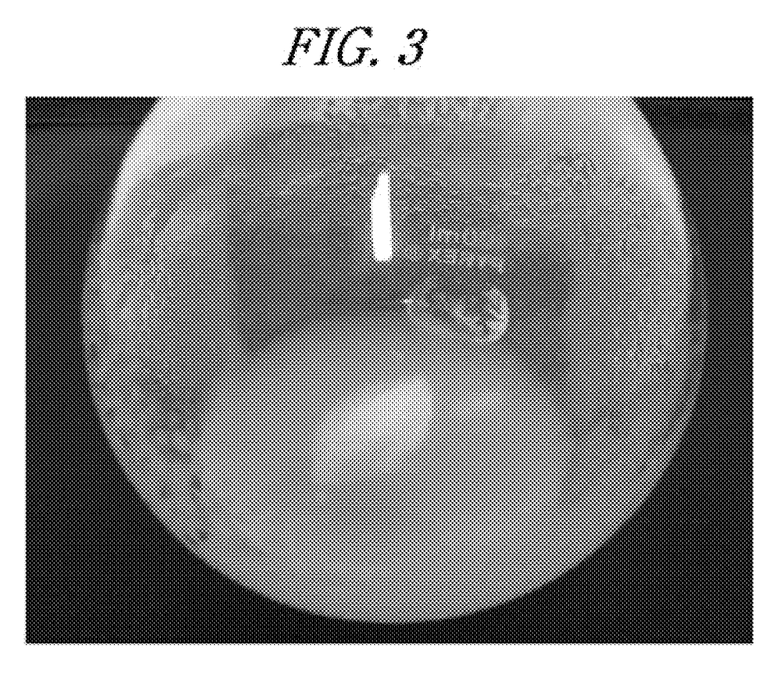
FIG. 3 is a photographic image of the mixture of N-methylpyrrolidine-alane and N-methylpyrrolidine in accordance with an illustrative embodiment of the present invention.
Figure 4:
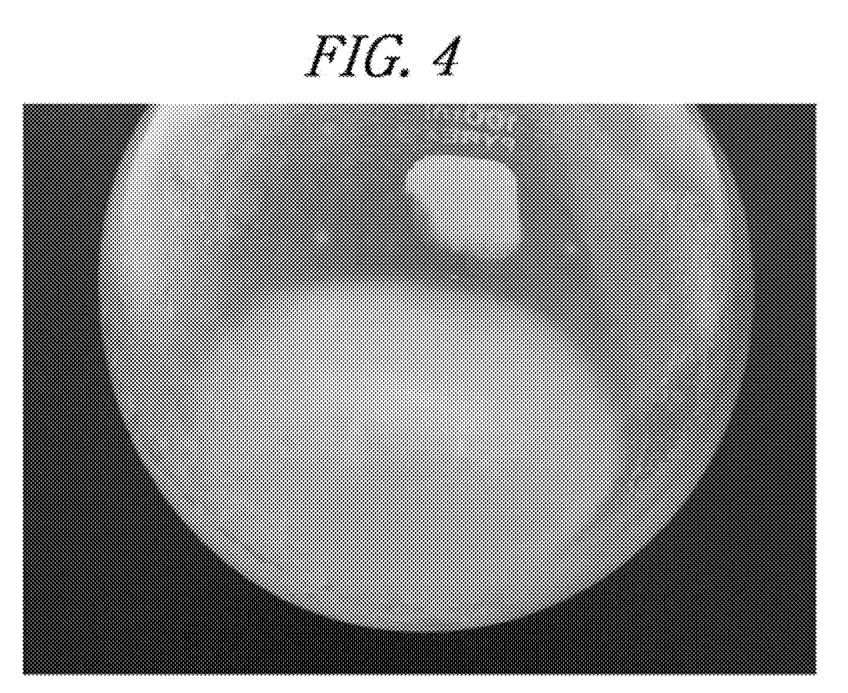
FIG. 4 is a photographic image of the mixture of N-methylpyrrolidine-alane and N-methylpyrrolidine in accordance with an illustrative embodiment of the present invention.
Figure 5:
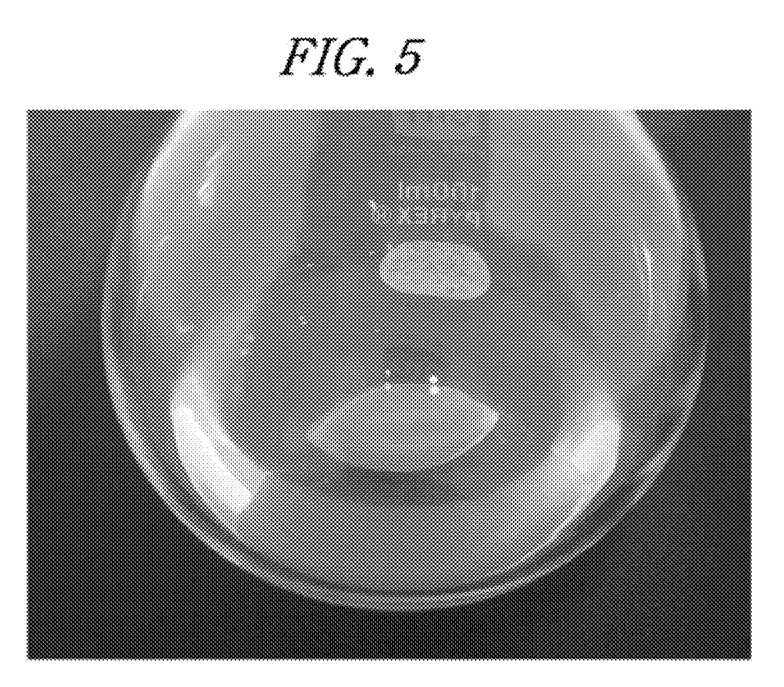
FIG. 5 is a photographic image of the mixture of N-methylpyrrolidine-alane and N-methylpyrrolidine in accordance with an illustrative embodiment of the present invention.

FIG. 3, FIG. 4 and FIG. 5 are photographic images of the three types of mixtures of N-methylpyrroridine and N-methylpyrroridine-alane.

When 0.5 equivalent of N-methylpyrroridine was added to 1 equivalent of N-methylpyrroridine-alane adduct in a transparent liquid phase, white solid, containing presumably $AlH_3 \cdot (MP)_2$, was formed in the solution (FIG. 3). Further addition of 0.5 equivalent of N-methylpyrroridine-alane to the solution (1 equivalent of N-methylpyrroridine to 1 equivalent of N-methylpyrroridine-alane) resulted in generating more solid $AlH_3 \cdot (MP)_2$ (FIG. 4). When 0.25 equivalent of N-methylpyrroridine was further added to the solution (1.25 equivalent of N-methylpyrroridine to 1 equivalent of N-methylpyrroridine-alane), the solution became a transparent liquid again (FIG. 5).

INDUSTRIAL APPLICABILITY

The disclosed precursor composition can be used to deposit an aluminum-containing film in a vapor deposition system.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A precursor composition for depositing an aluminum-containing thin film, comprising $AlH_3$ and N-methylpyrrolidine (MP),
   wherein a ratio of N-methylpyrrolidine (MP) to 1 equivalent of $AlH_3$ is from greater than 1 equivalent to no more than about 1.35 equivalent, or no less than about 2.25 equivalent.

2. The precursor composition of claim 1, wherein the precursor composition is obtained by mixing N-methylpyrroridine-alane (MPA) adduct with N-methylpyrrolidine (MP).

3. The precursor composition of claim 1, wherein the precursor composition is in a transparent liquid state at ambient temperature.

4. The precursor composition of claim 1, wherein the ratio of N-methylpyrrolidine (MP) to 1 equivalent of $AlH_3$ is from no less than about 2.25 equivalent to no more than about 1,000 equivalent.

5. The precursor composition of claim 1, wherein a ratio of N-methylpyrrolidine (MP) to 1 equivalent of $AlH_3$ is from no less than about 2.25 equivalent to no more than about 500 equivalent.

6. The precursor composition of claim 1, wherein a ratio of N-methylpyrrolidine (MP) to 1 equivalent of $AlH_3$ is from no less than about 2.25 equivalent to no more than about 200 equivalent.

7. The precursor composition of claim 1, wherein a ratio of N-methylpyrrolidine (MP) to 1 equivalent of $AlH_3$ is from no less than about 2.25 equivalent to no more than about 20 equivalent.

8. A manufacturing method of a precursor composition for depositing aluminum-containing thin film, comprising mixing N-methylpyrroridine-alane (MPA) adduct with N-methylpyrrolidine (MP),
   wherein a ratio of N-methylpyrrolidine (MP) to 1 equivalent of N-methylpyrroridine-alane (MPA) is greater than 0 equivalent to no more than about 0.35 equivalent, or no less than about 1.25 equivalent.

9. The manufacturing method of claim 8, wherein the ratio of N-methylpyrrolidine (MP) to 1 equivalent of N-methylpyrroridine-alane (MPA) is from no less than about 1.25 equivalent to no more than about 1,000 equivalent.

10. The manufacturing method of claim 8, wherein the ratio of N-methylpyrrolidine (MP) to 1 equivalent of N-methylpyrroridine-alane (MPA) is from no less than about 1.25 equivalent to no more than about 200 equivalent.

11. The manufacturing method of claim 8, wherein the ratio of N-methylpyrrolidine (MP) to 1 equivalent of N-methylpyrroridine-alane (MPA) is from no less than about 1.25 equivalent to no more than about 20 equivalent.

* * * * *